(12) United States Patent
Im et al.

(10) Patent No.: US 7,215,594 B2
(45) Date of Patent: May 8, 2007

(54) ADDRESS LATCH CIRCUIT OF MEMORY DEVICE

(75) Inventors: Jae-Hyuk Im, Icheon-si (KR); Kyoung-nam Kim, Andong-si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 23 days.

(21) Appl. No.: 10/980,350

(22) Filed: Nov. 3, 2004

(65) Prior Publication Data
US 2005/0213420 A1    Sep. 29, 2005

(30) Foreign Application Priority Data
Mar. 26, 2004   (KR) .................. 10-2004-0020832

(51) Int. Cl.
*G11C 8/00*    (2006.01)
*G11C 7/10*    (2006.01)
*H03K 3/12*    (2006.01)

(52) U.S. Cl. ................. 365/230.08; 365/189.05; 327/215; 327/218; 327/219

(58) Field of Classification Search ........... 365/230.08, 365/189.05; 327/57, 202, 215, 218, 219
See application file for complete search history.

(56) References Cited

U.S. PATENT DOCUMENTS

| | | | | |
|---|---|---|---|---|
| 5,898,331 A | * | 4/1999 | Fujita | 327/296 |
| 6,009,038 A | * | 12/1999 | Koshizuka | 365/230.08 |
| 6,275,441 B1 | * | 8/2001 | Oh | 365/230.04 |
| 6,414,879 B1 | * | 7/2002 | Ikeda | 365/189.01 |
| 6,477,108 B2 | * | 11/2002 | Arimoto et al. | 365/233 |
| 6,545,924 B2 | * | 4/2003 | Fujieda et al. | 365/222 |
| 6,566,929 B2 | * | 5/2003 | Pyo | 327/296 |
| 6,700,816 B2 | * | 3/2004 | Takahashi et al. | 365/185.07 |
| 6,809,982 B2 | * | 10/2004 | Fujima | 365/225.7 |

* cited by examiner

*Primary Examiner*—Amir Zarabian
*Assistant Examiner*—Anthan Tran
(74) *Attorney, Agent, or Firm*—Marshall, Gerstein & Borun LLP

(57) ABSTRACT

An address latch circuit of a memory device is disclosed. A latch operation is disabled while an address signal makes a level transition in the memory device, and then enabled when the address signal is stabilized after the level transition. Therefore, it is possible to reduce power consumption caused during the level transition of the address signal.

12 Claims, 1 Drawing Sheet

ADDRESS LATCH CIRCUIT OF MEMORY DEVICE

BACKGROUND OF THE INVENTION

1. Field of the Invention

The present invention relates to an address latch circuit of a memory device, and more particularly to such an address latch circuit wherein a latch operation is disabled while an address signal makes a level transition in the memory device, and then enabled when the address signal is stabilized after the level transition, thereby making it possible to reduce power consumption caused during the level transition of the address signal.

2. Description of the Related Art

In general, memory devices employing synchronous dynamic random access memories (DRAMs) require a very small amount of current consumption, and the amount of current consumption is one of the main factors to be extremely sensitively handled in battery-equipped devices such as notebook computers.

DRAMs must also have a latch circuit that latches an external address signal for a read/write operation of a specific memory cell or an internal address signal for a refresh operation of the memory cell for a predetermined period of time and then transfers the latched external or internal address signal to an associated bank.

FIG. 1 is a circuit diagram showing the configuration of an address latch circuit of a conventional memory device.

As shown in FIG. 1, the address latch circuit comprises a first transfer circuit 10 for transferring an external address signal eat<k> in response to an external address control signal extaxp, a second transfer circuit 15 for transferring an internal address signal iat<k> in response to an internal address control signal intaxp, a latch 20 for latching the external address signal eat<k> or internal address signal iat<k> transferred from the first or second transfer circuit 10 or 15, and an output driver 30 for amplifying and outputting the external address signal eat<k> or internal address signal iat<k> latched by the latch 20.

The external address control signal extaxp is able to drive large fan-out and load and is generated by generating an external address before control signal extaxp_before before the external address control signal extaxp is generated, namely, earlier by a delay time of a first delay 11 than the external address control signal extaxp, and passing the generated external address before control signal extaxp_before through a drive device, such as the first delay 11. Similarly, the internal address control signal intaxp is able to drive large fan-out and load and is generated by generating an internal address before control signal intaxp_before before the internal address control signal intaxp is generated, namely, earlier by a delay time of a second delay 16 than the internal address control signal intaxp, and passing the generated internal address before control signal intaxp_before through a drive device, such as the second delay 16.

The latch 20 includes a first inverter INV1 for inverting the external address signal eat<k> or internal address signal iat<k> transferred from the first or second transfer circuit 10 or 15, and a second inverter INV2 for inverting an output signal from the first inverter INV1 and applying the inverted signal as an input signal to the first inverter INV1 to latch the external address signal eat<k> or internal address signal iat<k>.

Accordingly, if the external address signal eat<k> is externally inputted, the external address control signal extaxp is generated to turn on a first transfer transistor 12 of the first transfer circuit 10, so as to transfer the external address signal eat<k>. Similarly, if the internal address signal iat<k> is internally inputted from an address generator (not shown) for a refresh operation, the internal address control signal intaxp is generated to turn on a second transfer transistor 14 of the second transfer circuit 15, so as to transfer the internal address signal iat<k>.

The transferred external address signal eat<k> or internal address signal iat<k> is changed from low to high in level or vice versa and constantly maintained by the first inverter INV1 and second inverter INV2 of the latch 20, and then amplified and outputted as an address signal at_row<k> by the output driver 30.

However, since this latch operation is performed with respect to all address signals, the number of address signal level transitions increases in the latch 20 as the number of address signals and the speed of a DRAM increase. The increased number of address signal level transitions leads to an increase in the number of events of power consumption resulting from the formation of a direct current path between a supply voltage terminal and a ground voltage terminal of the latch inverter, or the second inverter INV2, during the level transition and, in turn, an increase in power consumption.

SUMMARY OF THE INVENTION

Therefore, the present invention has been made in view of the above problems, and it is an object of the present invention to provide an address latch circuit of a memory device wherein a latch operation is disabled while an address signal makes a level transition in the memory device, and then enabled when the address signal is stabilized after the level transition, thereby making it possible to reduce power consumption caused during the level transition of the address signal.

In accordance with the present invention, the above and other objects can be accomplished by the provision of an address latch circuit of a memory device comprising: first transfer means for transferring a first address signal in response to a first address control signal; second transfer means for transferring a second address signal in response to a second address control signal; comparison means for outputting a latch control signal in response to first and second address before control signals, the first and second address before control signals being generated earlier than the first and second address control signals, respectively; latch means for latching the first or second address signal transferred from the first or second transfer means in response to the latch control signal from the comparison means; transfer time adjustment means for adjusting a transfer time of the latch control signal from the comparison means so as to control the operation of the latch means; and an output driver for amplifying and outputting the first address signal or second address signal latched by the latch means.

Preferably, the comparison means outputs the latch control signal when at least one of the first and second address before control signals is made active.

To this end, the comparison means may include a NOR gate for NORing the first and second address before control signals.

Preferably, the first address before control signal is generated earlier by a delay time of a first delay than the first address control signal, and the second address before control signal is generated earlier by a delay time of a second delay than the second address control signal.

Preferably, the transfer time adjustment means includes a third delay for delaying the latch control signal from the comparison means by a delay time thereof and transferring the delayed signal to the latch means.

The delay time of the third delay may be set to an OFF time of the latch means before the first address signal or second address signal from the first or second transfer means is applied to the latch means.

Preferably, the latch means includes: a first inverter for inverting the first address signal or second address signal transferred from the first or second transfer means; a second inverter for inverting an output signal from the first inverter and applying the inverted signal as an input signal to the first inverter; and a switch for switching an operation of the second inverter in response to the latch control signal from the comparison means.

Preferably, the second inverter and switch each include a plurality of MOS (Metal-Oxide Semiconductor) transistors, each of the MOS transistors having a channel length shorter than those of other MOS transistors constituting the latch means.

The first address control signal may be an external address control signal and the second address control signal may be an internal address control signal.

The first address before control signal may be an external address before control signal and the second address before control signal may be an internal address before control signal.

The first address signal may be an external address signal and the second address signal may be an internal address signal.

In a feature of the present invention, if an address signal is inputted after an address control signal is generated in the form of a pulse signal, a latch is turned off in response to an address before control signal generated earlier than the address control signal. As a result, a latch operation is not performed while the address signal makes a level transition. Thereafter, when the address signal is stabilized after the level transition and the address before control signal is made inactive, the latch is turned on to perform the latch operation. Therefore, it is possible to reduce power consumption caused during the level transition of the address signal.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
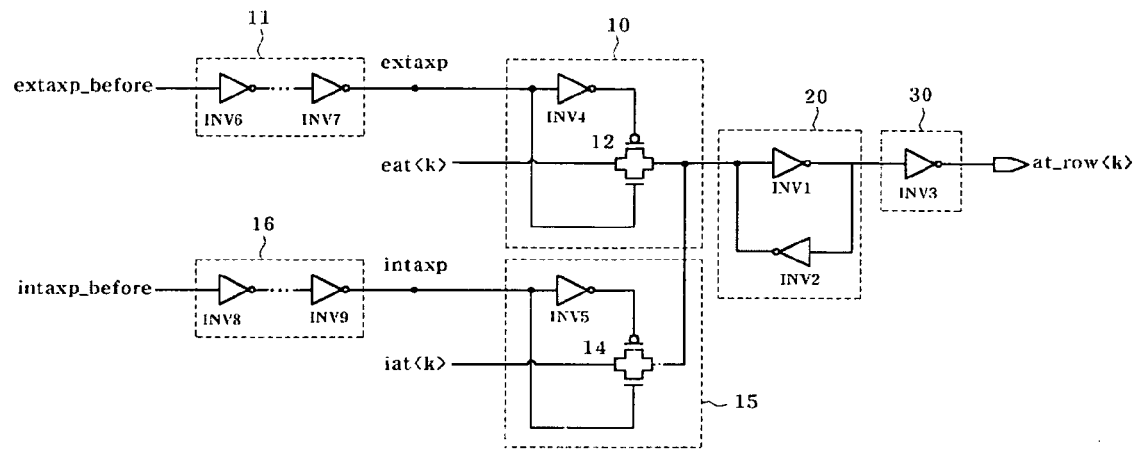
FIG. 1 is a circuit diagram showing the configuration of an address latch circuit of a conventional memory device.

Now, a preferred embodiment of the present invention will be described in detail with reference to the annexed drawing. Those skilled in the art will appreciate that the present embodiment is proposed for illustrative purposes and various modifications, additions and substitutions are possible, without departing from the scope and spirit of the invention. The same elements as those in the conventional configuration are denoted by the same reference numerals and referred to using the same terms.

Figure 2:
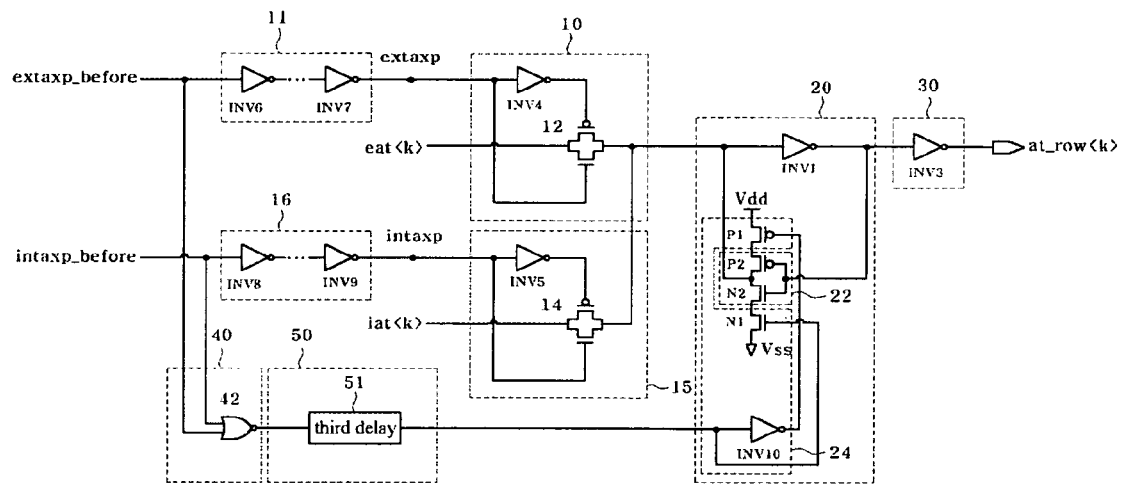
FIG. 2 is a circuit diagram showing the configuration of an address latch circuit of a memory device according to the present invention.

FIG. 2 is a circuit diagram showing the configuration of an address latch circuit of a memory device according to the present invention.

As shown in FIG. 2, the address latch circuit of the memory device according to the present invention comprises a first transfer circuit 10 for transferring an external address signal eat<k> in response to an external address control signal extaxp, a second transfer circuit 15 for transferring an internal address signal iat<k> in response to an internal address control signal intaxp, and a comparator 40 for outputting a latch control signal in response to an external address before control signal extaxp_before which is earlier by a delay time of a first delay 11 than the external address control signal extaxp and an internal address before control signal intaxp_before which is earlier by a delay time of a second delay 16 than the internal address control signal intaxp. The address latch circuit further comprises a latch 20 for latching the external address signal eat<k> or internal address signal iat<k> transferred from the first or second transfer circuit 10 or 15 in response to the latch control signal from the comparator 40, a transfer time adjuster 50 for adjusting a transfer time of the latch control signal from the comparator 40 so as to control the operation of the latch 20, and an output driver 30 for amplifying and outputting the external address signal eat<k> or internal address signal iat<k> latched by the latch 20.

The comparator 40 is provided with a NOR gate 42 for NORing the external address before control signal extaxp_before and the internal address before control signal intaxp_before.

The transfer time adjuster 50 is provided with a third delay 51 for delaying the latch control signal from the comparator 40 by a delay time thereof and transferring the delayed signal to the latch 20.

The delay time of the third delay 51 is set to an OFF time of the latch 20 before the external address signal eat<k> or internal address signal iat<k> from the first or second transfer circuit 10 or 15 is applied to the latch 20.

In other words, before the latch 20 is applied with the external address signal eat<k> or internal address signal iat<k> from the first or second transfer circuit 10 or 15, it is turned off so as not to perform the latch operation while the external address signal eat<k> or internal address signal iat<k> makes a level transition.

The latch 20 includes a first inverter INV1 for inverting the external address signal eat<k> or internal address signal iat<k> transferred from the first or second transfer circuit 10 or 15, a second inverter 22 for inverting an output signal from the first inverter INV1 and applying the inverted signal as an input signal to the first inverter INV1, and a switch 24 for switching the operation of the second inverter 22 in response to the latch control signal from the comparator 40.

In detail, the switch 24 includes a first PMOS (P-channel Metal-Oxide Semiconductor) transistor P1 and a first NMOS (N-channel Metal-Oxide Semiconductor) transistor N1 connected in series between a supply voltage terminal Vdd and a ground voltage terminal Vss and having their gates for receiving an inverted version of the latch control signal and the latch control signal, respectively. The second inverter 22 includes a second PMOS transistor P2 and a second NMOS transistor N2 for cooperating to invert the output signal from the first inverter INV1 and apply the inverted signal as the input signal to the first inverter INV1. The second PMOS transistor P2 and the second NMOS transistor N2 are connected in series between the first PMOS transistor P1 and the first NMOS transistor N1 and have their gates for receiving the output signal from the first inverter INV1 in common.

Preferably, the latch operation can be rapidly carried out by making the channel length of each of the first and second PMOS transistors P1 and P2 and the first and second NMOS transistors N1 and N2 in the second inverter 22 and switch 24 shorter than those of other MOS transistors constituting the latch 20.

A detailed description will hereinafter be given of the operation of the address latch circuit of the memory device with the above-stated configuration according to the present invention.

It should be noted herein that only the kth address signal, among a plurality of row address signals, is described for illustrative purposes although the latch circuit is provided and functions in the same manner with respect to all of the row address signals.

First, if the external address signal eat<k> is inputted, the external address control signal extaxp and the external address before control signal extaxp_before which is earlier by the delay time of the first delay 11 than the external address control signal extaxp are generated.

That is, the external address before control signal extaxp_before and the external address control signal extaxp are sequentially generated with a time difference therebetween as pulse signals with low to high level transitions. Then, the external address control signal extaxp is applied to the first transfer circuit 10 to turn on a first transfer transistor 12 thereof. As a result, the external address signal eat<k> is transferred to the latch 20 through the first transfer transistor 12.

The external address before control signal extaxp_before is applied to the comparator 40. Since the external address before control signal extaxp_before is high in level, the NOR gate 42 outputs a low-level latch control signal. This low-level latch control signal is delayed by the third delay 51 and then inverted by a tenth inverter INV10 of the switch 24. Thereafter, the inverted latch control signal is applied to the gate of the first PMOS transistor P1 to turn off the first PMOS transistor P1, and the latch control signal is applied to the gate of the first NMOS transistor N1 to turn off the first NMOS transistor N1.

At this time, the delay time of the third delay 51 of the transfer time adjuster 50 is adjusted such that the external address signal eat<k> with level transition is transferred through the first transfer circuit 10 and arrives at the latch 20 after the first PMOS transistor P1 and the first NMOS transistor N1 are turned off.

Accordingly, the second PMOS transistor P2 and second NMOS transistor N2 of the second inverter 22 float, so the external address signal eat<k> applied to the latch 20 is inverted by the first inverter INV1, but not fed back, while it makes a level transition. Namely, the latch operation is not performed while the external address signal eat<k> makes a level transition.

On the other hand, in the case where the internal address signal iat<k> is inputted, the present address latch circuit is operated in the same manner as in the case where the external address signal eat<k> is inputted.

As described above, if at least one of the external address before control signal extaxp_before and internal address before control signal intaxp_before is generated, the first PMOS transistor P1 and first NMOS transistor N1 of the switch 24 in the latch 20 are turned off to cause the second PMOS transistor P2 and second NMOS transistor N2 of the second inverter 22 to float. As a result, no direct current path is formed between the supply voltage terminal Vdd and the ground voltage terminal Vss, thus reducing power consumption.

However, in the case where the external address before control signal extaxp_before or internal address before control signal intaxp_before returns to low in level after being generated, the external address control signal extaxp or internal address control signal intaxp returns to low in level, too, thereby causing the first transfer transistor 12 of the first transfer circuit 10 and the second transfer transistor 14 of the second transfer circuit 15 to be turned off so as to block an input to the latch 20.

Also, the NOR gate 42 of the comparator 40 outputs a high-level latch control signal so as to turn on the first PMOS transistor P1 and first NMOS transistor N1 of the switch 24, thereby causing the output signal from the first inverter INV1 to be inverted by the second PMOS transistor P2 and second NMOS transistor N2 of the second inverter 22 and applied as the input signal to the first inverter INV1. As a result, the latch operation is normally performed by constantly maintaining the input external address signal eat<k> or internal address signal iat<k>.

In other words, whereas the external address signal eat<k> or internal address signal iat<k> makes a low to high level transition or vice versa and then keeps up the current level, the external address before control signal extaxp_before or internal address before control signal intaxp_before and the external address control signal extaxp or internal address control signal intaxp are pulse signals that temporarily go from low to high in level when the external address signal eat<k> or internal address signal iat<k> is generated.

Thus, the time when the external address control signal extaxp or internal address control signal intaxp is generated can be determined to be the time when the level transition of the external address signal eat<k> or internal address signal iat<k> occurs. In this regard, if at least one of the external address control signal extaxp and internal address control signal intaxp is generated, the latch operation is disabled by the external address before control signal extaxp_before or internal address before control signal intaxp_before. Therefore, it is possible to reduce power consumption caused during the level transition of the external address signal eat<k> or internal address signal iat<k> inputted to the latch 20.

As apparent from the above description, the present invention provides an address latch circuit of a memory device wherein a latch operation is disabled while an address signal makes a level transition in the memory device, and then enabled when the address signal is stabilized after the level transition. Therefore, it is possible to reduce power consumption caused during the level transition of the address signal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An address latch circuit of a memory device comprising:
    first transfer means for transferring a first address signal in response to a first address control signal;
    second transfer means for transferring a second address signal in response to a second address control signal;
    comparison means for outputting a latch control signal in response to first and second address before control signals, said first and second address before control signals being generated earlier than said first and second address control signals, respectively;

latch means for latching said first or second address signal transferred from said first or second transfer means in response to said latch control signal from said comparison means;

transfer time adjustment means for adjusting a transfer time of said latch control signal from said comparison means so as to control the operation of said latch means; and an output driver for amplifying and outputting said first address signal or second address signal latched by said latch means.

2. The address latch circuit as set forth in claim 1, wherein said comparison means is adapted to output said latch control signal when at least one of said first and second address before control signals is made active.

3. The address latch circuit as set forth in claim 1, wherein said comparison means includes a NOR gate for NORing said first and second address before control signals.

4. The address latch circuit as set forth in claim 1, wherein said first address before control signal is generated earlier by a delay time of a first delay than said first address control signal.

5. The address latch circuit as set forth in claim 1, wherein said second address before control signal is generated earlier by a delay time of a second delay than said second address control signal.

6. The address latch circuit as set forth in claim 1, wherein said transfer time adjustment means includes a third delay for delaying said latch control signal from said comparison means by a delay time thereof and transferring the delayed signal to said latch means.

7. The address latch circuit as set forth in claim 6, wherein said delay time of said third delay is set to an OFF time of said latch means before said first address signal or second address signal from said first or second transfer means is applied to said latch means.

8. The address latch circuit as set forth in claim 1, wherein said latch means includes:
  a first inverter for inverting said first address signal or second address signal transferred from said first or second transfer means;
  a second inverter for inverting an output signal from said first inverter and applying the inverted signal as an input signal to said first inverter; and
  a switch for switching an operation of said second inverter in response to said latch control signal from said comparison means.

9. The address latch circuit as set forth in claim 8, wherein said second inverter and switch each include a plurality of MOS (Metal-Oxide Semiconductor) transistors, each of said MOS transistors having a channel length shorter than those of other MOS transistors constituting said latch means.

10. The address latch circuit as set forth in claim 1, wherein said first address control signal is an external address control signal and said second address control signal is an internal address control signal.

11. The address latch circuit as set forth in claim 1, wherein said first address before control signal is an external address before control signal and said second address before control signal is an internal address before control signal.

12. The address latch circuit as set forth in claim 1, wherein said first address signal is an external address signal and said second address signal is an internal address signal.

* * * * *